United States Patent
Tu et al.

(10) Patent No.: US 11,257,870 B2
(45) Date of Patent: Feb. 22, 2022

(54) DISPLAY PANEL HAVING COLOR CONVERSION LAYER AND DISPLAY DEVICE THEREOF

(71) Applicant: Shenzhen China Star Optoelectronics Semiconductor Display Technology Co., Ltd., Shenzhen (CN)

(72) Inventors: Aiguo Tu, Shenzhen (CN); Jinchuan Li, Shenzhen (CN); Yuanchun Wu, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 114 days.

(21) Appl. No.: 16/753,774

(22) PCT Filed: Jan. 9, 2020

(86) PCT No.: PCT/CN2020/071227
§ 371 (c)(1),
(2) Date: Apr. 5, 2020

(87) PCT Pub. No.: WO2021/134822
PCT Pub. Date: Jul. 8, 2021

(65) Prior Publication Data
US 2021/0202584 A1    Jul. 1, 2021

(30) Foreign Application Priority Data
Dec. 30, 2019   (CN) .......................... 201911391699.8

(51) Int. Cl.
*H01L 27/32* (2006.01)
*H01L 51/52* (2006.01)
*H01L 51/50* (2006.01)

(52) U.S. Cl.
CPC ........ *H01L 27/322* (2013.01); *H01L 27/3244* (2013.01); *H01L 51/5016* (2013.01); *H01L 51/5284* (2013.01)

(58) Field of Classification Search
USPC ........................................................ 257/40
See application file for complete search history.

(56) References Cited

U.S. PATENT DOCUMENTS

| | | | |
|---|---|---|---|
| 6,458,475 B1 * | 10/2002 | Adachi | H01L 51/0077 313/504 |
| 2007/0007883 A1 * | 1/2007 | Takeda | H05B 33/10 313/503 |
| 2017/0335181 A1 * | 11/2017 | Kim | C07D 209/86 |
| 2018/0088458 A1 * | 3/2018 | Shen | G03F 7/0007 |
| 2018/0100956 A1 * | 4/2018 | Lee | G02B 5/3058 |
| 2020/0111842 A1 * | 4/2020 | Kim | H01L 51/5271 |

* cited by examiner

*Primary Examiner* — Nduka E Ojeh

(57) ABSTRACT

A display panel and a display device are provided. The display panel includes an organic electroluminescence device and a color conversion layer disposed on the organic electroluminescence device. The color conversion layer includes a quantum dot material and an organic electroluminescence material. The organic electroluminescent material is added to the color conversion layer. By mixing the organic electroluminescent material and the quantum dot material, the organic electroluminescent material forms excitons under excitation of blue light, and then singlet state excitons are transferred to quantum dots by fluorescence resonance energy, thereby improving an efficiency of the color conversion layer.

16 Claims, 1 Drawing Sheet

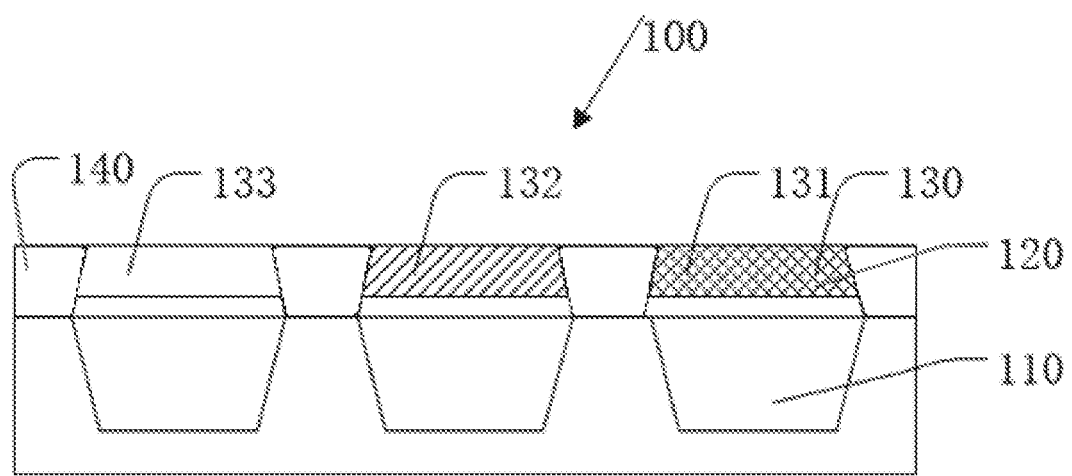

DISPLAY PANEL HAVING COLOR CONVERSION LAYER AND DISPLAY DEVICE THEREOF

RELATED APPLICATIONS

This application is a National Phase of PCT Patent Application No. PCT/CN2020/071227 having International filing date of Jan. 9, 2020, which claims the benefit of priority of Chinese Patent Application No. 201911391699.8 filed on Dec. 30, 2019. The contents of the above applications are all incorporated by reference as if fully set forth herein in their entirety.

FIELD AND BACKGROUND OF THE INVENTION

The present application relates to the technical field of display panels, and in particular, to a display panel and a display device.

For large-sized organic light-emitting diode (OLED) display devices, in order to achieve 8K resolution, bottom-gate devices decrease an aperture ratio due to an increase in a number of thin film transistors (TFTs), and service life of the OLED devices is reduced to one-third of that of 4K OLED television (TV). Top-gate devices mainly include two technical solutions of top emission white light with color filter and top emission blue light with quantum dot color filter (or quantum dot film).

Large-sized OLED display devices, especially quantum dot organic electroluminescence devices with blue light and quantum dot color filters, have low conversion efficiency of quantum dots, and urgently need to improve an efficiency of light conversion layers.

Therefore, it is really necessary to develop a new type of display panel to overcome defects of the conventional art.

SUMMARY OF THE INVENTION

Technical Problem

An object of the present invention is to provide a display panel capable of solving the problem of low quantum dot conversion efficiency of the display panel in the conventional art.

Technical Solutions

To achieve the above object, the present invention provides a display panel including an organic electroluminescent device; and a color conversion layer disposed on the organic electroluminescent device, wherein the color conversion layer includes a quantum dot material and an organic electroluminescent material.

The organic electroluminescent material is added to the color conversion layer. By mixing the organic electroluminescent material and the quantum dot material, the organic electroluminescent material forms excitons under the excitation of blue light, and then singlet state excitons are transferred to the quantum dots by fluorescence resonance energy, thereby improving the efficiency of the color conversion layer.

Furthermore, in other embodiments, the display panel further including a color filter, wherein the color conversion layer is arranged in the color filter, light emitted from the organic electroluminescent device is blue light, and the color filter is attached to the organic electroluminescent device.

Furthermore, in other embodiments, the color conversion layer in the color filter includes a red conversion layer and a green conversion layer.

Furthermore, in other embodiments, the organic electroluminescent device includes a substrate, a thin film transistor structure layer disposed on the substrate, a pixel electrode layer disposed on the thin film transistor structure layer, a planarization layer disposed on the pixel electrode layer, and an anode layer disposed on the planarization layer, wherein the anode layer is in contact with the pixel electrode layer.

Furthermore, in other embodiments, the color filter further includes a black color resist layer disposed on the organic electroluminescent device and disposed in a same layer as the color conversion layer.

Furthermore, in other embodiments, the organic electroluminescent material is a fluorescent luminous material, the red conversion layer is filled with a red quantum dot material and a red fluorescent luminous material, and the green conversion layer is filled with a green quantum dot material and a green fluorescent material.

Furthermore, in other embodiments, the red fluorescent luminous material is a rhodamine-based dye, and the green fluorescent luminous material is one or more of a coumarin dye, a quinacridone, a hexabenzocoronene, and an aniline material.

Furthermore, in other embodiments, the organic electroluminescent material is a phosphorescent host material and a thermoluminescent material.

Furthermore, in other embodiments, the phosphorescent host material is one of 4,4'-Bis(N-carbazolyl)-1,1'-biphenyl (CBP), 4,4'-bis (9-carbazolyl)-2,2'-dimethyl (CDBP), 1,3-Bis(N-carbazolyl)benzene (mCP), N,N'-dicarbazolyl-1,4-dimethene-benzene (DCB), deschloroclozapine (DCZ), 2,2-bis (4-carbazol-9-yl-phenyl) adamantane (Ad-Cz), 3,6-di (9-carbazolyl)-9-(2-ethyl hexyl) carbazole (TCz1), fluorene-carbazole linked molecules (CBZ1-F2), 3,5-bis(9-carbazolyl)tetraphenylsilane (SimCP), 1,3,5-N, N'', N'' trizolyl methyl -2,4,6-trimethyl (TCTEB), 2,6-bis(3-9H-carbazol-9-yl-phenyl)pyridine (26DCzPPy), mammalian phenotype ontology (MPO12), 4,4',4''-tris(carbazol-9-yl)-triphenylamine (TCTA), 2,2',2''-(1,3,5-phenylene)tris [1-phenyl-1H-benzimidazole] (TPBi), poly(9-vinylcarbazole) (PVK), poly (9,9'-alkyl-3,6-silafluorene) (PSiFC6C6), poly(9,9'-bis(2-ethylhexyl)-3,6-fluorene) (P36EHF), 4,4'-N,N'-[di(3, 6-di(t-butyl)carbazole]biphenyl (ttbCBP), compact fluorescent lamp (CFL) material, (tris[4-(9-phenylfluoren-9-yl)phenyl] amine) (TFTPA), 9-(4-triphenylsilanyl-(1,1',4,1'')-terphenyl-4''-yl)-9H-carbazole (TSTC), biphenyl backbone (BOBP3), bifluorene analogue (T2N). 2,2',2''-(1,3,5-benzinetriyl)-tris(1-phenyl-1-H -benzimidazole) (TPBI), 2,5-bis (2-(9Hcarbazol-9-yl)phenyl)-1,3,4-oxadiazole (o-CzOXD), 4,7-dicarbazol-9-yl- [1,10]-phenanthroline (BUPH1), dibenzofuran (DBF), spiro-9,9'-bifluoren-2-yl-diphenylphosphine oxide (SPPO1), electron transport phosphine oxides (PO1), 2,7-bis(diphenylphosphine oxide)-9,9-dimethylfluorene (PO6), 3,5-bis(3-(9H -carbazol-9-yl)phenyl) pyridine (35DCzPPy), 2,2-bis(4-carbazolylphenyl)-1,1-biphenyl (4CzPBP), 1,1'-bis(3-carbazolylphenyl)-2,2'-biphenyl (3CZPBP), composite basalt fiber (CBF), 1,3,5-N, N', N'' trizolyl methyl -2,4,6-trimethyl (TCTEB), and a combination thereof; the thermoluminescent material is a triazine derivative, a triazole, a diazole and thiadiazole derivative, a heptazine ring derivative, a benzothiazole and benzoxazole derivative, a quinoxaline derivative, or a diazepine derivative.

Furthermore, in other embodiments, the organic electroluminescent material is a phosphorescent host material and a phosphorescent luminous material, and the phosphorescent luminous material is an iridium complex luminous material.

The present invention also provides a display device including the display panel according to the present invention.

Beneficial Effect

Compared with the conventional art, the present invention has the beneficial effect that the present invention provides a display panel and a display device. An organic electroluminescent material is added to the color conversion layer. By mixing the organic electroluminescent material and the quantum dot material, the organic electroluminescent material forms excitons under the excitation of blue light, and then singlet state excitons are transferred to the quantum dots by fluorescence resonance energy, thereby improving the efficiency of the color conversion layer.

BRIEF DESCRIPTION OF THE SEVERAL VIEWS OF THE DRAWINGS

The following detailed description of specific embodiments of the present application will make the technical solutions and other beneficial effects of the present application obvious in conjunction with the accompanying drawings.

FIG. 1 is a schematic structural diagram of a display panel according to an embodiment of the present invention.

REFERENCE NUMBER DESCRIPTION display panel, 100; organic electroluminescence device, 110;
color filter, 120; color conversion layer, 130;
red conversion layer, 131; green conversion layer, 132;
white light layer, 133; and black color resist layer, 140.

DESCRIPTION OF SPECIFIC EMBODIMENTS OF THE INVENTION

The technical solutions in the embodiments of the present application will be clearly and completely described below with reference to the accompanying drawings in the embodiments of the present application. Obviously, the following drawings merely relate to some embodiments of the present disclosure, and based on these drawings, a person skilled in the art may obtain the other drawings without any creative effort.

In the description of the present invention, it is to be understood that the terms such as "center", "longitudinal", "transverse", "length", "width", "thickness", "upper", "lower", "front", "rear", "left", "right", "vertical", "horizontal", "top", "bottom", "inside", "outside", "clockwise", "counterclockwise", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, unless otherwise defined, any technical or scientific term used herein shall have the common meaning understood by a person of ordinary skills. Such words as "first" and "second" used in the specification and claims are merely used to differentiate different components rather than to represent any order, number or importance. In the description of the present invention, the meaning of "plurality" is two or more unless specifically defined otherwise.

In the description of this application, it should be noted that the terms "installation", "connected", and "coupled" should be understood in a broad sense, unless explicitly stated and limited otherwise. For example, they may be fixed connections, removable connected or integrally connected; it can be mechanical, electrical, or can communicate with each other; it can be directly connected, or it can be indirectly connected through an intermediate medium, it can be an internal communication of two elements or an interaction relationship of two elements. For those of ordinary skill in the art, the specific meanings of the above terms in this application can be understood according to specific situations.

In the present invention, the first feature "on" or "under" the second feature can include direct contact of the first and second features, and can also be included that the first and second features are not in direct contact but are contacted by additional features between them, unless otherwise specifically defined and defined. Moreover, the first feature is "above", "on", and "on the top of" of the second feature, including the first feature directly above and diagonally above the second feature, or simply means that the first feature is horizontally higher than the second feature. The first feature is "under", "below", and "beneath" the second feature, including the first feature directly below and diagonally below the second feature, or merely the first feature is horizontally less than the second feature.

The following disclosure provides many different implementations or examples for implementing different structures of the present application. To simplify the disclosure of this application, the components and settings of specific examples are described below. Of course, they are merely examples and are not intended to limit the application. Furthermore, the present application may repeat reference numbers and/or reference letters in different examples, and such repetition is for the sake of simplicity and clarity, and does not by itself indicate a relationship between the various embodiments and/or settings discussed. In addition, examples of various specific processes and materials are provided in this application, but those of ordinary skill in the art can be aware of the application of other processes and/or the use of other materials.

Specifically, please refer to FIG. 1, which shows a display panel 100 according to an embodiment provided by the present invention. The display panel 100 includes an organic electroluminescent device 110 and a color filter 120.

Specifically, the organic electroluminescent device 110 includes a substrate, a thin film transistor structure layer disposed on the substrate, a pixel electrode layer disposed on the thin film transistor structure layer, a planarization layer disposed on the pixel electrode layer, and an anode layer disposed on the planarization layer. The anode layer is in contact with the pixel electrode layer.

The color filter 120 is attached to the organic electroluminescence device 110. The color filter 120 includes a color conversion layer 130 and a black color resist layer 140.

The color conversion layer 130 is disposed in the color filter 120. Light emitted from the organic electroluminescent device 110 is blue light. The color conversion layer 130 includes a red conversion layer 131 and a green conversion layer 132.

The color conversion layer 130 includes a quantum dot material and an organic electroluminescent material. The organic electroluminescent material is added to the color conversion layer 130. By mixing the organic electroluminescent material and the quantum dot material, the organic electroluminescent material forms excitons under the excitation of blue light, and then singlet state excitons are transferred to the quantum dots by fluorescence resonance energy, thereby improving the efficiency of the color conversion layer 130.

Specifically, the organic electroluminescent material is a fluorescent luminous material. The red conversion layer 131 is filled with a red quantum dot material and a red fluorescent luminous material, and the green conversion layer 132 is filled with a green quantum dot material and a green light fluorescent luminous material.

The red fluorescent luminous material is a rhodamine-based dye, and the green fluorescent luminous material is one or more of a coumarin dye, a quinacridone, a hexabenzocoronene, and an aniline material.

In other embodiments, the organic electroluminescent material can also be the phosphorescent host material and a phosphorescent luminous material. The phosphorescent host material is one of 4,4'-Bis(N-carbazolyl)-1,1'-biphenyl (CBP), 4,4'-bis (9-carbazolyl)-2,2'-dimethyl (CDBP), 1,3-Bis(N-carbazolyl)benzene (mCP), N,N'-dicarbazolyl-1,4-dimethene-benzene (DCB), deschloroclozapine (DCZ), 2,2-bis (4-carbazol-9-yl-phenyl) adamantane (Ad-Cz), 3,6-di (9-carbazolyl)-9-(2-ethyl hexyl) carbazole (TCz1), fluorene-carbazole linked molecules (CBZ1-F2), 3,5-bis(9-carbazolyl)tetraphenylsilane (SimCP), 1,3,5-N, N", N" trizolyl methyl -2,4,6-trimethyl (TCTEB), 2,6-bis(3-9H-carbazol-9-yl-phenyl)pyridine (26DCzPPy), mammalian phenotype ontology (MPO12), 4,4',4"-tris(carbazol-9-yl)-triphenylamine (TCTA), 2,2',2"-(1,3,5-phenylene)tris[1-phenyl-1H-benzimidazole] (TPBi), poly(9-vinylcarbazole) (PVK), poly(9,9'-alkyl-3,6-silafluorene) (PSiFC6C6), poly(9,9'-bis(2-ethylhexyl)-3,6-fluorene) (P36EHF), 4,4'-N,N'- [di(3, 6-di (t-butyl)carbazole]biphenyl (ttbCBP), compact fluorescent lamp (CFL) material, (tris[4-(9-phenylfluoren-9-yl)phenyl]amine) (TFTPA), 9-(4-triphenylsilanyl-(1,1',4,1")-terphenyl-4"-yl)-9H-carbazole (TSTC), biphenyl backbone (BOBP3), bifluorene analogue (T2N). 2,2',2"-(1,3,5-benzinetriyl)-tris(1-phenyl-1-H-benzimidazole) (TPBI), 2,5-bis (2-(9Hcarbazol-9-yl)phenyl)-1,3,4-oxadiazole (o-CzOXD), 4,7-dicarbazol-9-yl- [1,10]-phenanthroline (BUPH1), dibenzofuran (DBF), spiro-9,9'-bifluoren-2-yl-diphenylphosphine oxide (SPPO1), electron transport phosphine oxides (PO1), 2,7-bis(diphenylphosphine oxide)-9,9-dimethylfluorene (PO6), 3,5-bis(3-(9H-carbazol-9-yl)phenyl) pyridine (35DCzPPy), 2,2bis(4-carbazolylphenyl)- 1,1-biphenyl (4CzPBP), 1,1'-bis(3-carbazolylphenyl)-2,2'-biphenyl (3CZPBP), composite basalt fiber (CBF), 1,3,5-N, N', N" trizolyl methyl -2,4,6-trimethyl (TCTEB), or a combination thereof, and the phosphorescent luminous material is an iridium complex luminous material.

A white light layer 133 is disposed on the organic electroluminescent device 110 and disposed in a same layer as the color conversion layer 130.

The black color resist layer 140 is disposed on the organic electroluminescent device 110 and disposed in a same layer as the color conversion layer 130.

The display panel 100 further includes an encapsulation cover, which is disposed above the color filter 120.

The present invention further provides a display device including the display panel 100 according to the present invention.

The beneficial effect of the present invention is that the present invention provides a display panel and a display device. An organic electroluminescent material is added to the color conversion layer. By mixing the organic electroluminescent material and the quantum dot material, the organic electroluminescent material forms excitons under the excitation of blue light, and then singlet state excitons are transferred to the quantum dots by fluorescence resonance energy, thereby improving the efficiency of the color conversion layer.

In the above embodiments, the description of each embodiment has its own emphasis. For a part that is not described in detail in one embodiment, reference may be made to related descriptions in other embodiments.

The display panel provided in the embodiment of the present application has been described in detail above. The technical scope of the present invention is not limited to the above description, a person skilled in the art can make various modifications and changes to the above embodiments without departing from the technical idea of the present invention, and such variations and modifications are intended to be within the scope of the invention.

What is claimed is:

1. A display panel, comprising:
   an organic electroluminescent device; and
   a color conversion layer disposed on the organic electroluminescent device, wherein the color conversion layer comprises a quantum dot material and an organic electroluminescent material,
   wherein the organic electroluminescent material is a phosphorescent host material and a thermoluminescent material; and
   wherein the thermoluminescent material is a triazine derivative, a triazole, a diazole and thiadiazole derivative, a heptazine ring derivative, a benzothiazole, a quinoxaline derivative, or a diazepine derivative.

2. The display panel according to claim 1, further comprising a color filter, wherein the color conversion layer is arranged in the color filter, light emitted from the organic electroluminescent device is blue light, and the color filter is attached to the organic electroluminescent device.

3. The display panel according to claim 2, wherein the color conversion layer in the color filter comprises a red conversion layer and a green conversion layer.

4. The display panel according to claim 3, wherein the organic electroluminescent material is a fluorescent luminous material, the red conversion layer is filled with a red quantum dot material and a red fluorescent luminous material, and the green conversion layer is filled with a green quantum dot material and a green fluorescent material.

5. The display panel according to claim 4, wherein the red fluorescent luminous material is a rhodamine-based dye, and the green fluorescent luminous material is one or more of a coumarin dye, a quinacridone, a hexabenzocoronene, and an aniline material.

6. The display panel according to claim 2, wherein the color filter further comprises a black color resist layer disposed on the organic electroluminescent device and disposed in a same layer as the color conversion layer.

7. The display panel according to claim 1, wherein the phosphorescent host material is one of 4,4'-Bis(N-carbazolyl)-1,1'-biphenyl (CBP), 4,4'-bis (9-carbazolyl)-2,2'-dimethyl (CDBP), 1,3-Bis(N-carbazolyl)benzene (mCP), N,N'-dicarbazolyl-1,4-dimethene-benzene (DCB), deschloroclozapine (DCZ), 2,2-bis (4-carbazol-9-yl-phenyl) adamantane (Ad-Cz), 3,6-di (9-carbazolyl)-9-(2-ethyl hexyl) carbazole (TCz1), fluorene-carbazole linked molecules (CBZ1-F2), 3,5-bis(9-carbazolyl)tetraphenylsilane (SimCP), 1,3,5-N, N", N" trizolyl methyl -2,4,6-trimethyl (TCTEB), 2,6-bis(3-9H-carbazol-9-yl-phenyl)pyridine (26DCzPPy), mammalian phenotype ontology (MPO12), 4,4',4''-tris(carbazol-9-yl)-triphenylamine (TCTA), 2,2',2''-(1,3,5-phenylene)tris [1-phenyl-1H-benzimidazole] (TPBi), poly(9-vinylcarbazole) (PVK), poly(9,9'-alkyl-3,6-silafluorene) (PSiFC6C6), poly(9,9'-bis(2-ethylhexyl)-3,6-fluorene) (P36EHF), 4,4'-N,N'- [di(3, 6-di(t-butyl)carbazole]biphenyl (ttbCBP), compact fluorescent lamp (CFL) material, (tris[4-(9-phenylfluoren-9yl)phenyl]amine) (TFTPA), 9-(4-triphenylsilanyl-(1,1',4,1'')-terphenyl-4''-yl)-9H -carbazole (TSTC), biphenyl backbone (BOBP3), bifluorene analogue (T2N). 2,2',2''-(1,3,5-benzinetriyl)-tris(1-phenyl-1-H-benzimidazole) (TPB I), 2,5-bis(2-(9Hcarbazol-9-yl)phenyl)-1, 3,4-oxadiazole (o-CzOXD), 4,7-dicarbazol-9-yl- [1,10]-phenanthroline (BUPH1), dibenzofuran (DBF), spiro-9,9'-bifluoren-2-yl-diphenylphosphine oxide (SPPO1), electron transport phosphine oxides (PO1), 2,7-bis(diphenylphosphine oxide)-9,9-dimethylfluorene (PO6), 3,5-bis(3-(9H-carbazol-9-yl)phenyl)pyridine (35DCzPPy), 2,2-bis(4-carbazolylphenyl)-1,1-biphenyl (4CzPBP), 1,1'-bis(3-carbazolylphenyl)-2,2'-biphenyl (3CZPBP), composite basalt fiber (CBF), 1,3,5-N, N', N'' trizolyl methyl -2,4,6-trimethyl (TCTEB), or a combination thereof.

8. The display panel according to claim 1, wherein the organic electroluminescent material is a phosphorescent host material and a phosphorescent luminous material, and the phosphorescent luminous material is an iridium complex luminous material.

9. A display device, comprising the display panel according to claim 1.

10. The display device according to claim 9, further comprising a color filter, wherein the color conversion layer is arranged in the color filter, light emitted from the organic electroluminescent device is blue light, and the color filter is attached to the organic electroluminescent device.

11. The display device according to claim 10, wherein the color conversion layer in the color filter comprises a red conversion layer and a green conversion layer.

12. The display device according to claim 11, wherein the organic electroluminescent material is a fluorescent luminous material, the red conversion layer is filled with a red quantum dot material and a red fluorescent luminous material, and the green conversion layer is filled with a green quantum dot material and a green fluorescent material.

13. The display device according to claim 12, wherein the red fluorescent luminous material is a rhodamine-based dye, and the green fluorescent luminous material is one or more of a coumarin dye, a quinacridone, a hexabenzocoronene, and an aniline material.

14. The display device according to claim 10, wherein the color filter further comprises a black color resist layer disposed on the organic electroluminescent device and disposed in a same layer as the color conversion layer.

15. The display device according to claim 9, wherein the phosphorescent host material is one of 4,4'-Bis(N-carbazolyl)-1,1'-biphenyl (CBP), 4,4'-bis (9-carbazolyl)-2,2'-dimethyl (CDBP), 1,3-Bis(N-carbazolyl)benzene (mCP), N,N'-dicarbazolyl-1,4-dimethene-benzene (DCB), deschloroclozapine (DCZ), 2,2-bis (4-carbazol-9-yl-phenyl) adamantane (Ad-Cz), 3,6-di (9-carbazolyl)-9-(2-ethyl hexyl) carbazole (TCz1), fluorene-carbazole linked molecules (CBZ1-F2), 3,5-bis(9-carbazolyl)tetraphenylsilane (SimCP), 1,3,5-N, N'', N'' trizolyl methyl -2,4,6-trimethyl (TCTEB), 2,6-bis(3-9H-carbazol-9-yl-phenyl)pyridine (26DCzPPy), mammalian phenotype ontology (MPO12), 4,4',4''-tris(carbazol-9-yl)-triphenylamine (TCTA), 2,2',2''-(1,3,5-phenylene)tris [1-phenyl-1H-benzimidazole] (TPBi), poly(9-vinylcarbazole) (PVK), poly(9,9'-alkyl-3,6-silafluorene) (PSiFC6C6), poly(9,9'-bis(2-ethylhexyl)-3,6-fluorene) (P36EHF), 4,4'-N,N'-[di(3, 6-di(t-butyl)carbazole]biphenyl (ttbCBP), compact fluorescent lamp (CFL) material, (tris[4-(9-phenylfluoren-9yl)phenyl]amine) (TFTPA), 9-(4-triphenylsilanyl-(1,1',4,1'')-terphenyl-4''-yl)-9H -carbazole (TSTC), biphenyl backbone (BOBP3), bifluorene analogue (T2N). 2,2',2''-(1,3,5-benzinetriyl)-tris(1-phenyl-1-H-benzimidazole) (TPBI), 2,5-bis(2-(9Hcarbazol-9-yl)phenyl)-1,3, 4-oxadiazole (o-CzOXD), 4,7-dicarbazol-9-yl- [1,10]-phenanthroline (BUPH1), dibenzofuran (DBF), spiro-9,9'-bifluoren-2-yl-diphenylphosphine oxide (SPPO1), electron transport phosphine oxides (PO1), 2,7-bis(diphenylphosphine oxide)-9,9-dimethylfluorene (PO6), 3,5-bis(3-(9H-carbazol-9-yl)phenyl)pyridine (35DCzPPy),2,2-bis(4-carbazolylphenyl)-1,1-biphenyl (4CzPBP), 1,1'-bis(3-carbazolylphenyl)-2,2'-biphenyl (3CZPBP), composite basalt fiber (CBF), 1,3,5-N, N', N'' trizolyl methyl -2,4,6-trimethyl (TCTEB), or a combination thereof; and the thermoluminescent material is a triazine derivative, a triazole, a diazole and thiadiazole derivative, a heptazine ring derivative, a benzothiazole, a quinoxaline derivative, or a diazepine derivative.

16. The display device according to claim 9, wherein the organic electroluminescent material is a phosphorescent host material and a phosphorescent luminous material, and the phosphorescent luminous material is an iridium complex luminous material.

\* \* \* \* \*